United States Patent [19]
Lee et al.

[11] Patent Number: 6,049,486
[45] Date of Patent: Apr. 11, 2000

[54] TRIPLE MODE ERASE SCHEME FOR IMPROVING FLASH EEPROM CELL THRESHOLD VOLTAGE ($V_T$) CYCLING CLOSURE EFFECT

[75] Inventors: Jian-Hsing Lee, Hsin-Chu; Kuo-Reay Peng, Faung-San, both of Taiwan

[73] Assignee: Taiwan Semiconductor Manufacturing Company, Hsin-Chu, Taiwan

[21] Appl. No.: 09/224,982

[22] Filed: Jan. 4, 1999

[51] Int. Cl.[7] ................................................. G11C 16/04
[52] U.S. Cl. ............................. 365/185.33; 365/185.29; 365/185.26
[58] Field of Search ................ 365/185.29, 185.19, 365/185.26, 185.27, 185.2, 185.33, 185.28

[56] References Cited

U.S. PATENT DOCUMENTS

| | | | |
|---|---|---|---|
| 5,231,602 | 7/1993 | Radjy et al. ............................. | 365/185 |
| 5,357,476 | 10/1994 | Kuo et al. ............................... | 365/218 |
| 5,412,608 | 5/1995 | Ogama .................................... | 365/218 |
| 5,414,669 | 5/1995 | Tedrow et al. .......................... | 365/226 |
| 5,416,738 | 5/1995 | Shrivastava ............................. | 365/185 |
| 5,481,494 | 1/1996 | Tang et al. ......................... | 365/185.24 |
| 5,485,423 | 1/1996 | Tang et al. ............................... | 365/185 |
| 5,491,757 | 2/1996 | Haddad et al. ..................... | 365/185.27 |
| 5,521,866 | 5/1996 | Akaogi ................................ | 365/185.29 |
| 5,546,340 | 8/1996 | Hu et al. .............................. | 365/185.3 |
| 5,581,502 | 12/1996 | Richart et al. ..................... | 365/185.26 |
| 5,596,528 | 1/1997 | Kaga et al. ......................... | 365/185.24 |
| 5,598,369 | 1/1997 | Chen et al. ......................... | 365/185.27 |
| 5,726,933 | 3/1998 | Lee et al. ........................... | 365/185.18 |
| 5,760,605 | 6/1998 | Go ......................................... | 326/49 |
| 5,781,477 | 7/1998 | Rinerson et al. .................. | 365/185.29 |
| 5,790,460 | 8/1998 | Chen et al. ......................... | 365/185.29 |
| 5,838,618 | 11/1998 | Lee et al. ............................ | 365/185.29 |
| 5,862,078 | 1/1999 | Yeh et al. ........................... | 365/185.29 |

*Primary Examiner*—David Nelms
*Assistant Examiner*—Thong Le
*Attorney, Agent, or Firm*—George O. Saile; Stephen B. Ackerman; Billy Knowles

[57] ABSTRACT

A multiple phase method to erase data from a flash EEPROM eliminates electrical charges trapped in the tunneling oxide of a flash EEPROM to maintain proper separation of the programmed threshold voltage and the erased threshold voltage after extended programming and erasing cycles. The method to erase a flash EEPROM cell begins by negative gate erasing to remove charges from the floating gate by first applying a first relatively large negative voltage pulse to the control gate. Concurrently a first moderately large positive voltage pulse is applied to the source. Also, concurrently a ground reference potential is applied to the first well and the semiconductor substrate, and the drain and second well are disconnected to allow the drain and second well to float. The flash EEPROM cell is then source erased to further remove charges from the floating gate by floating the drain and the second well and concurrently applying the ground reference potential to the semiconductor substrate, the drain, and the first well. Simultaneously, a relatively large positive voltage pulse is applied to the source. The flash EEPROM is then channel erased to detrap charges from the tunneling oxide by applying a second relatively large negative voltage pulse to the control gate of the EEPROM cell and concurrently applying a second moderately large positive voltage pulse to the first well. At this same time, a ground reference potential is applied to the semiconductor substrate and the drain, the source, and the second well are floated.

59 Claims, 9 Drawing Sheets

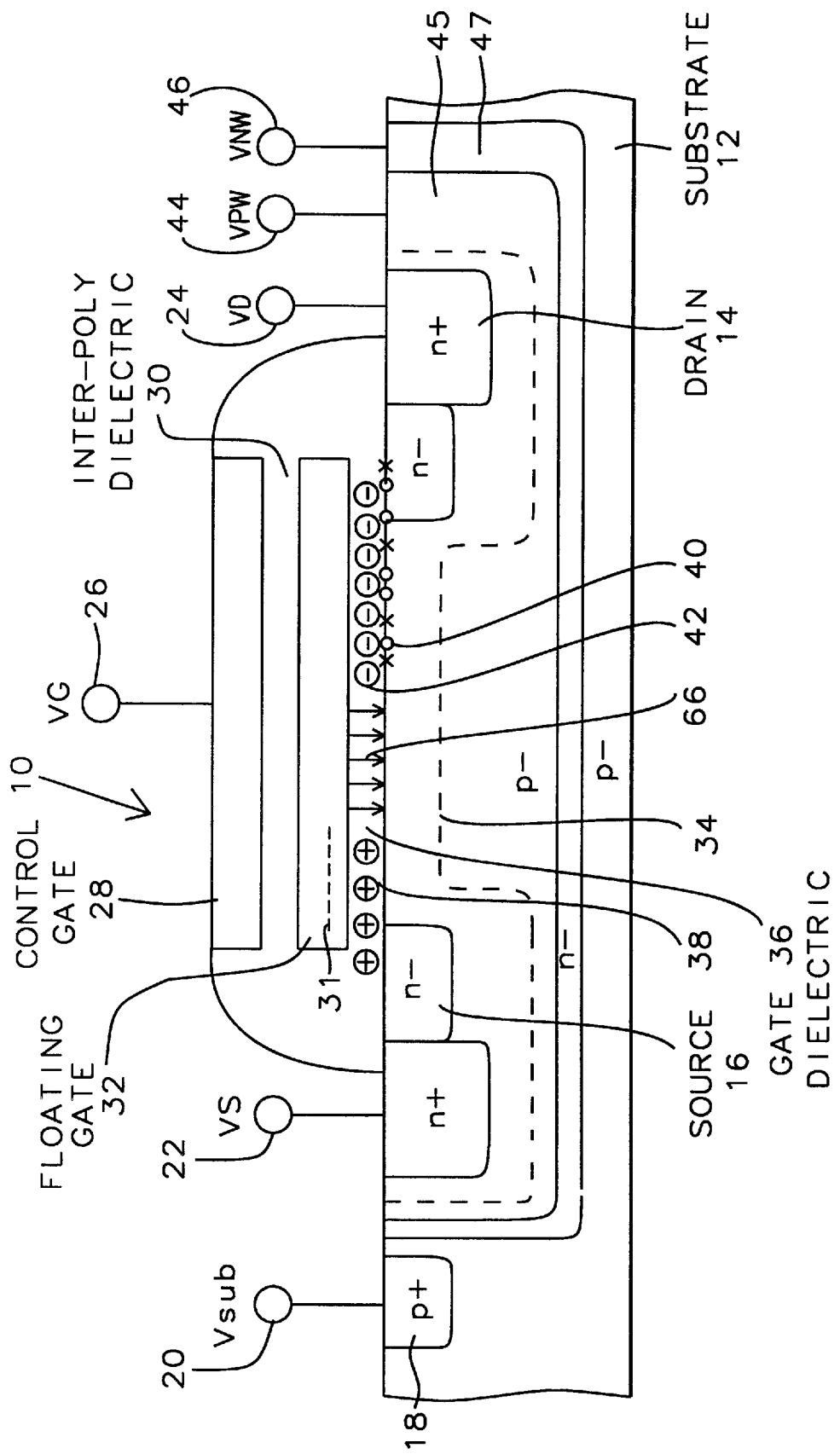
FIG. 1 – Prior Art

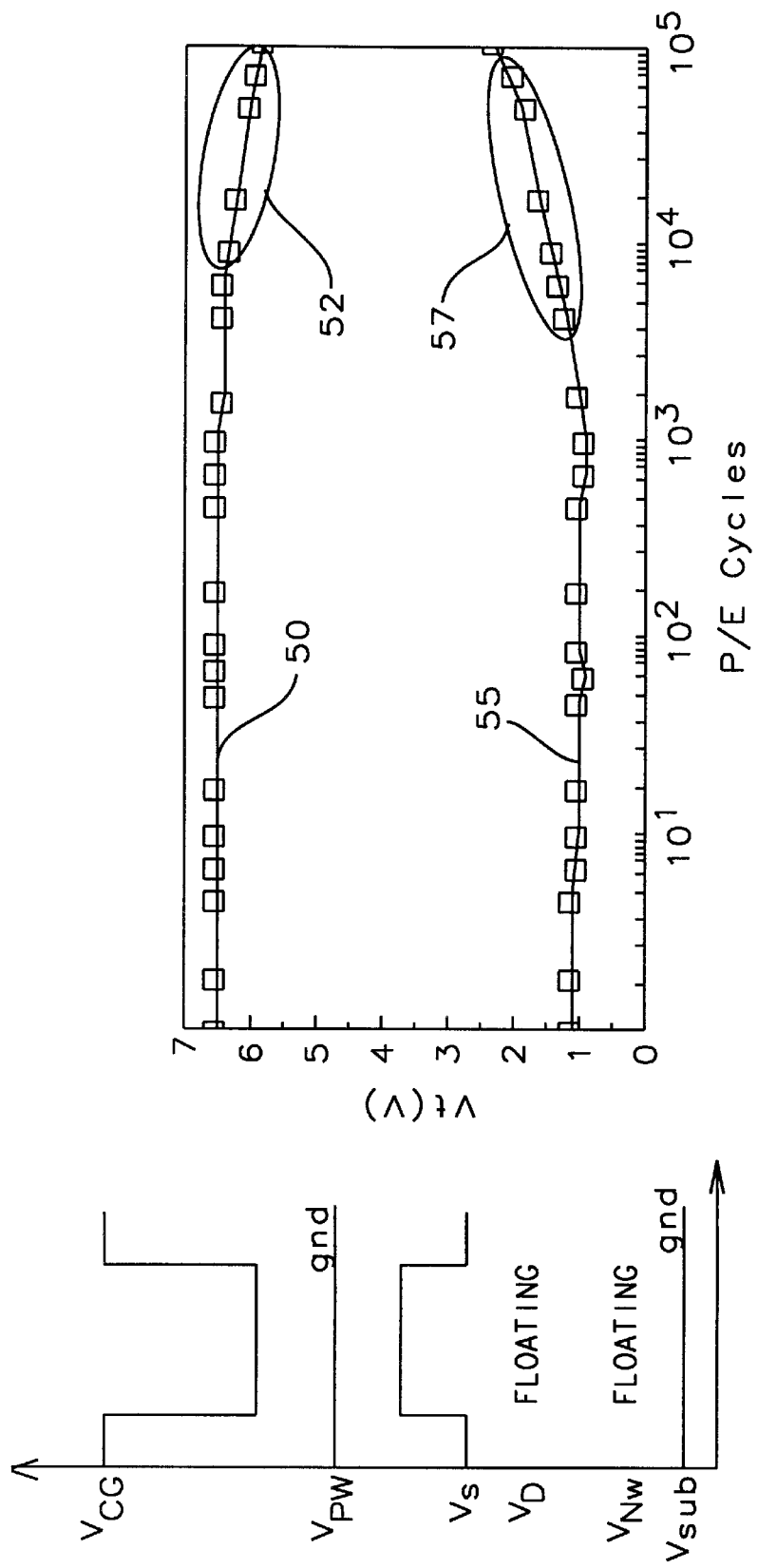
FIG. 2a - Prior Art
FIG. 2b - Prior Art

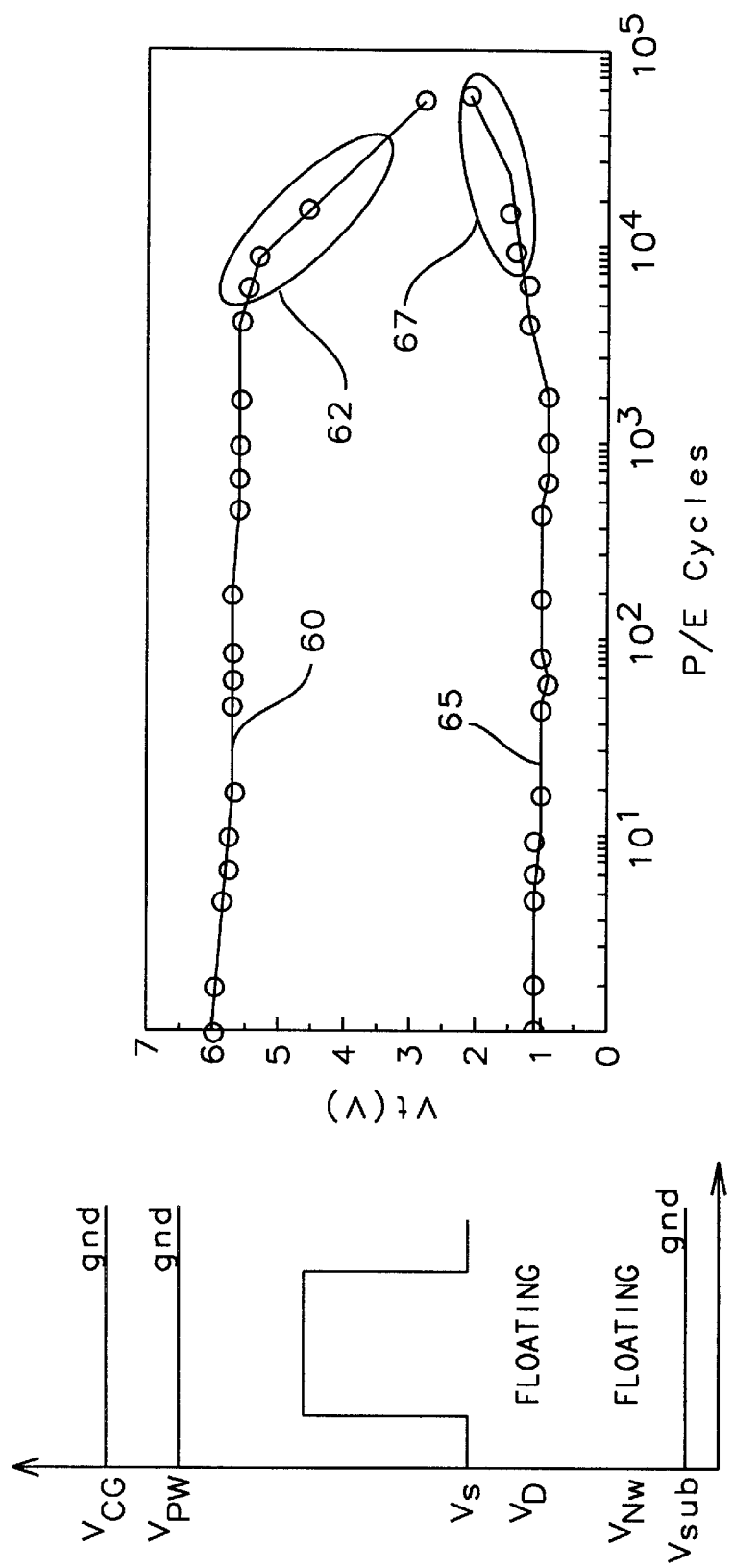
FIG. 3b – Prior Art
FIG. 3a – Prior Art

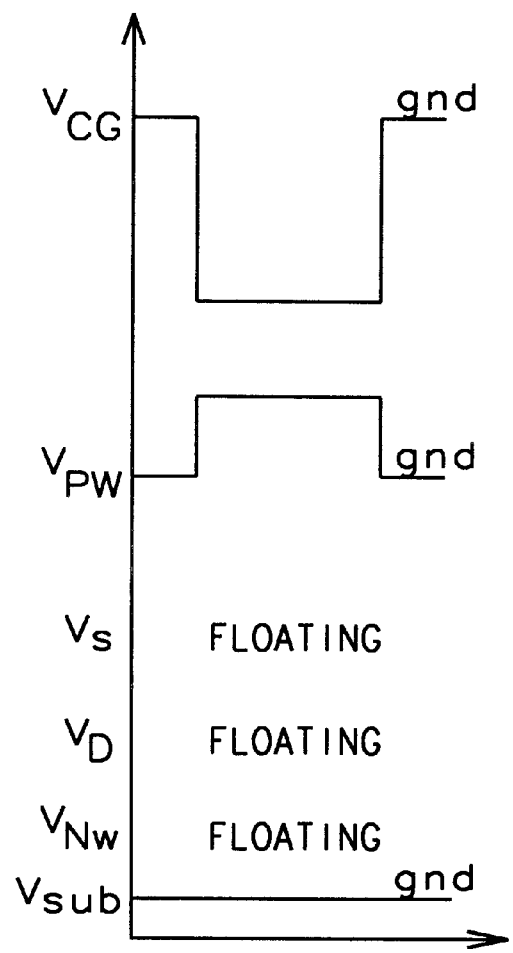
FIG. 4a - Prior Art

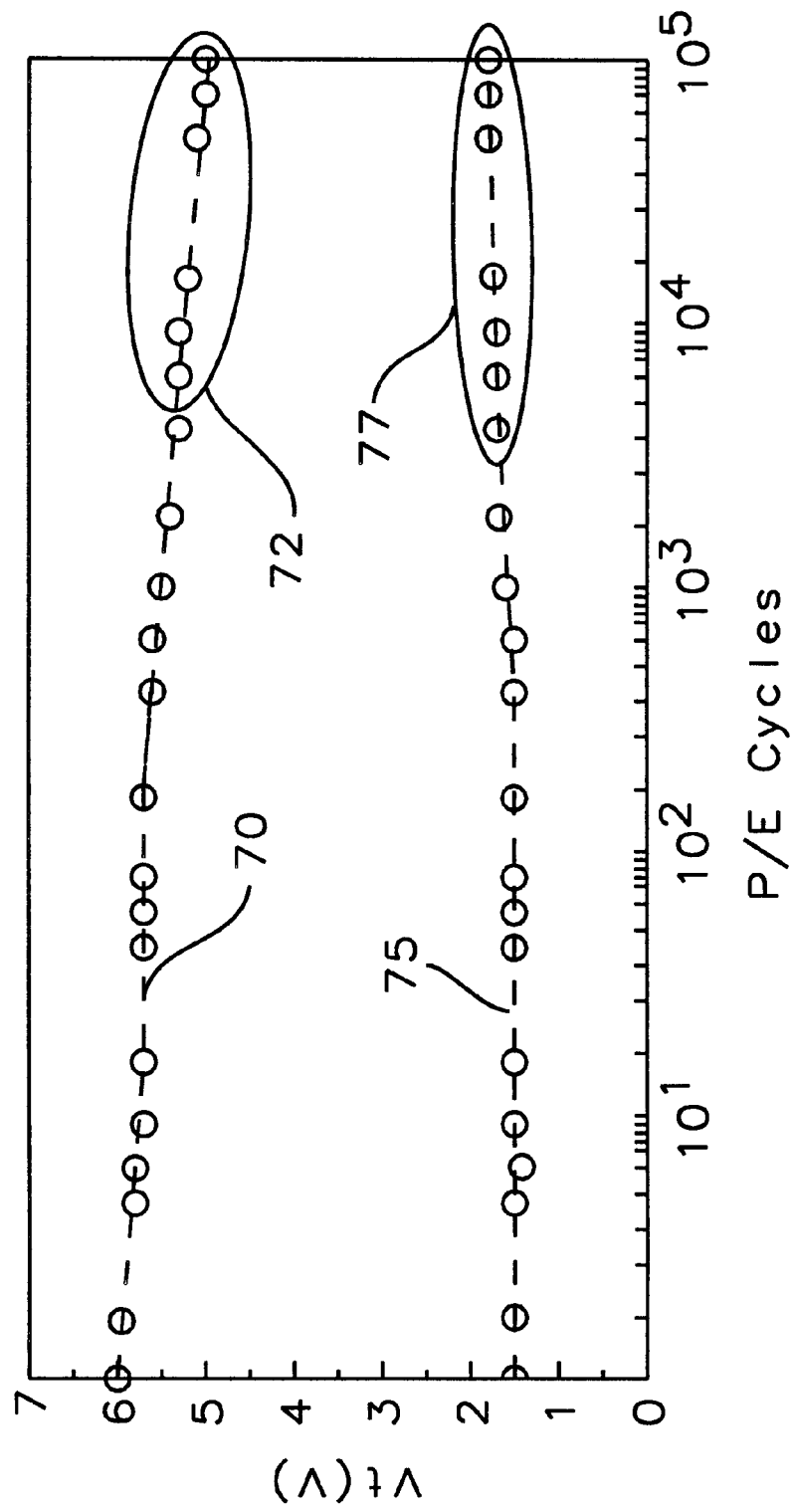
FIG. 4b – Prior Art

TRIPLE MODE ERASE SCHEME FOR IMPROVING FLASH EEPROM CELL THRESHOLD VOLTAGE ($V_T$) CYCLING CLOSURE EFFECT

RELATED PATENT APPLICATIONS

Ser. No.: 08/928,217, Filing Date: Sep. 12, 1997, "A Novel Method To Improve Flash EEPROM Write/Erase Threshold Closure," assigned to the Same Assignee as the present invention.

U.S. Pat. No. 5,838,618, issued Nov. 17, 1998, "A Bi-Modal Erase Method For Eliminating Cycling-induced Flash EEPROM Cell Write/Erase Threshold Closure," assigned to the Same Assignee as the present invention.

Ser. No.: 08/957,678, Filing Date: Oct. 24, 1997, "A Novel Erase Method Of Flash EEPROM By Using Snapback Characteristic," assigned to the Same Assignee as the present invention.

Ser. No.: 09/150,907, Filing Date: Sep. 10, 1998, "An Erase Method to Improve Flash EEPROM Endurance by Combining High Voltage Source Erase and Negative Gate Erase," assigned to the Same Assignee as the present invention.

BACKGROUND OF THE INVENTION

1. Field of the Invention

This invention relates generally to a class of non-volactile memory devices referred to as flash electrically erasable programmable read-only memory (flash EEPROM). More particularly, this invention relates to methods and means to erase digital data from a flash EEPROM cell and for eliminating trapped charges from the flash EEPROM cell to prevent closure of the difference of the programmed threshold voltage and the erase threshold voltage of the flash EEPROM cell.

2. Description of Related Art

The structure and application of the flash EEPROM is well known in the art. The Flash EEPROM provides the density advantages of an erasable programmable read-only memory (EPROM) that employs ultra-violet light to eliminate the programming with the speed of a standard EEPROM FIG. 1 illustrates a cross-sectional view of a flash EEPROM cell of the prior art. The flash EEPROM cell 10 is formed within a P-type substrate 12. An N-type material is implanted within the P-type substrate 12 to a lightly doped concentration to for the N-well 47. Within the N-well 47, a P-type material is implanted to a lightly doped concentration to form the P-well 45. An $N^+$ drain region 14 and an $N^+$ source region 16 are formed within the P-type well 45.

A relatively thin gate dielectric 36 is deposited on the surface of the P-type substrate 12. The thin gate dielectric 36 will also be referred to as a tunneling oxide, hereinafter. A poly-crystalline silicon floating gate 32 is formed on the surface of the gate dielectric 36 above the channel region 34 between the drain region 14 and source region 16. An interpoly dielectric layer 30 is placed on the floating gate 32 to separate the floating gate 32 from a second layer of poly-crystalline silicon that forms a control gate 28.

A P+ diffusion 18 is placed in the P-type substrate 12 to provide a low resistance path from a terminal 20 to the P-type substrate. The terminal 20 will be attached to a substrate voltage generator VSub. In most application of an EEPROM, the substrate voltage generator VSub will be set to the ground reference potential (0V).

The source region 16 will be connected to a source voltage generator VS through the terminal 22. The control gate 28 will be connected through the terminal 26 to the control gate voltage generator VG. And the drain region 14 will be connected through the terminal 24 to the drain voltage generator VD. The P-well 45 is connected to a P-well voltage generator VPw through terminal 44. The N-well 47 is connected to the N-well voltage generator VNw through the terminal 46.

According to conventional operation, the flash EEPROM cell 10 is programmed by setting the gate control voltage generator VG to a relatively high positive voltage (on the order of 10V). The drain voltage generator VD is set to a moderately high voltage (on the order of 5V), while the source voltage generator VS and the P-well voltage generator VPw are set to the ground reference potential (0V). The N-well voltage generator VNw is disconnected from the terminal 46 to allow the N-well 47 to float.

With the voltages as described above, hot electrons will be produced in the channel 34 near the drain region 14. These hot electrons will have sufficient energy to be accelerated across the gate dielectric 36 and trapped on the floating gate 32. The trapped hot electrons will cause the threshold voltage of the field effect transistor (FET) that is formed by the flash EEPROM cell 10 to be increased by three to five volts. This change in threshold voltage by the trapped hot electrons causes the cell to be programmed.

During the programming process, some of the hot electrons will be trapped 42 in the tunneling oxide 36 or in surface states 40 at the surface of the P-type substrate 12. These trapped electrons will cause the threshold voltage of the erased flash EEPROM cell 10 to increase.

U.S. Pat. No. 5,481,494 (Tang et al. 494), U.S. Pat. No. 5,485,423 (Tang et al. 423), U.S. Pat. No. 5,412,608 Oyama), U.S. Pat. No. 5,414,669 (Tedrow et al.), U.S. Pat. No. 5,790,460 (Chen et al.), U.S. Pat. No. 5,416,738 (Shrivasta), U.S. Pat. No. 5,546,340 (Hu et al.), and U.S. Pat. No. 5,781,477 (Rinerson et al.) each describe a form of erasing a flash EEPROM conventionally referred to as Negative Gate Erase. To erase the flash EEPROM cell 10 using Negative Gate Erase, as shown in FIG. 2, a moderately high positive voltage (on the order of 5V) is generated by the source voltage generator VS. Concurrently, the gate control voltage generator VG is set to a relatively large negative voltage (on the order of −10V). The substrate voltage generator VSub and the P-well voltage generator VPw are set to the ground reference potential. The drain voltage generator VD and the N-well voltage generator VNw are respectively usually disconnected from the terminal 24 to allow the drain region 14 to float from the terminal 44 to allow the N-well 47 to float. Under these conditions there is a large electric field developed across the tunneling oxide 36 in the source region 16. This field causes the electrons trapped in the floating gate 32 to flow to portion of the floating gate 32 that overlaps the source region 16. The electrons are then extracted to the source region 16 by the Fowler-Nordheim tunneling.

Referring back to FIG. 1, during the erasure process, because of band to band tunneling, some positive charges or "hot holes" 38 are forced into the tunneling oxide 36 and trapped there in the tunneling oxide 36. Further, defects 40 at the interface of the tunneling oxide 36 and the P-well 45 will create trapped positive charges. These trapped positive charges or "hot holes" 38 and the interface traps 40 will cause the threshold voltage of the programmed flash EEPROM cell 10 to decrease. As can be shown in FIG. 3, after repeatedly performing write/erase cycling, the combination of the decrease 52 in the programmed threshold voltage 50 and the increase 57 in the erased threshold voltage 55 will cause the separation of the programmed threshold voltage 50 and the erased threshold voltage 55 to close until the flash EEPROM cell 10 fails. At this time, the flash EEPROM will operate less reliably to store digital data.

Further Tang et al. 494 shows a method for tightening the threshold voltage $V_T$ distribution of an array of flash EEPROM cells. The moderately high positive voltage (5V) that is applied to the source regions of the array of flash EEPROM cells and the relatively large negative voltage that is applied to the control gate insure a tighter distribution of the thresholds of the array of cells. The value of a load resistor between the low positive voltage and the source region is simultaneously reduced to a predetermined value so as to compensate for the increased erase time caused by the lowering of the magnitude of the negative constant voltage.

Tang et al. 423 describes a method of erasure of a flash EEPROM. A moderately large positive voltage pulse is generated by the source voltage generator VS. Simultaneously, a negative ramp voltage is developed by the gate control voltage generator VG. The drain voltage generator VG will be disconnected from the drain to allow the drain to float and the substrate voltage generator will be set to the ground reference potential as above described. This method will achieve an averaging of the tunneling field during the entire erase cycle.

A variant of the negative gate erase is the positive gate erase discussed in U.S. Pat. No. 5,760,605 (Go). In Go the control gate is brought to a voltage level of approximately +11.0V and the source is brought to the ground reference potential. These biasing conditions allow a net negative potential to be "stored" on the floating gate to establish the "erased" condition. For programming of the flash EEPROM cell the control gate is brought to the ground reference potential, the drain is brought to a voltage of approximately +13.0V and the source is brought to approximately +11.0V. A net positive potential is thus "stored" on the floating gate to establish the "programmed" condition.

Oyama and Hu et al. further discuss techniques for equalization of the threshold voltage $V_T$ after erase or correction of over erase conditions.

U.S. Pat. No. 5,596,528 (Kaya et al.), U.S. Pat. No. 5,491,657 (Haddad et al.), U.S. Pat. No. 5,357,476 (Ku et al.), U.S. Pat. No. 5,598,369 (Chen et al.), U.S. Pat. No. 5,581,502 (Richert et al.), U.S. Pat. No. 5,726,933 (Lee et al. 933) and Hu et al. each describe a form of erasing the flash EEPROM cell 10 conventionally referred to as a Source Erase. To erase the flash EEPROM cell 10 using Source Erase, as shown in FIG. 3a, a relatively high positive voltage (on the order of +10.0V) is generated by the source voltage generator Vs. The control gate voltage generator VG, the P-well voltage generator VPw, and the substrate voltage generator VSub are each set to the ground reference potential. The drain voltage generator VD and the N-well voltage generator VNw are generally disconnected respectively form the drain region 14 and the N-well 47 to allow the drain region 14 and the N-well 47 to be floating. Under these biasing conditions there is similarly a large electric field is developed across the tunneling oxide 36 in the source region 16. This electric field causes the electrons 31 trapped in the floating gate 32 to be extracted to the source region 16 by the Fowler-Nordheim tunneling.

FIG. 3b shows the threshold voltage $V_T$ versus the number of repeated program/erase cycles of the flash EEPROM. As described above, the "hot holes" 38 and the interface traps 40 of FIG. 1 create positive charges that raise the threshold voltage $V_T$ of the flash EEPROM cell. The combination of the decrease 62 in the programmed threshold 60 and the increase 67 of the erased threshold voltage 65 causes the separation of the programmed threshold voltage 60 and the erase threshold voltage 65 to close until the flash EEPROM cell fails. At this time, the flash EEPROM cell will no longer be able to retain the digital data reliably.

U.S. Pat. No. 5,231,602 (Radjy et al.) describes a method of erasing a flash EEPROM cell by controlling the electric field across the tunneling oxide. The drain is connected through a variable resistor to a programming voltage source and a variable voltage source is connected to the source. The variable is voltage source is adjusted between 0 and 5V, while the programming voltage source is set between 5V and 20V. The tunneling current is optimized by adjustment of the variable resistor and the variable voltage.

A third method of erasure of a flash EEPROM cell is described in U.S. Pat. No. 5,521,866 (Akaogi) and is termed a Channel Erase. Channel Erase, as shown in FIG. 4a, has the control gate voltage generator VG set to a relatively large negative voltage (−10.0V) to place the control gate 28 at the relatively large negative voltage. The P-well voltage generator VPw is set to a moderately high voltage (+5.0V) to set the P-well 45 to the moderately high voltage.

The source 16, the drain 14, and the N-well are respectively disconnected from the source voltage generator Vs, the drain voltage generator VD, and the N-well voltage generator VNw to cause the source 16, the drain 14, and the N-well to be floating. The substrate voltage generator VSub is set to the ground reference potential so that the substrate is biased to the ground reference potential.

FIG. 4b illustrates the degradation of the programmed threshold voltage 70 and the erased threshold voltage 75 as the cumulative number of program/erase cycles of the flash EEPROM is increased. In the Channel Erase, the negative charges 31 are extracted across the surface of the floating gate 32 through the tunneling oxide 36 to the P-well 45. Some of these charges will be trapped in the tunneling oxide 36. As the number of program/erase cycles is increase, the programmed threshold voltage 70 begins to decrease 72, while the erased threshold voltage 75 increases modestly 77. This indicates that eventually the difference between the programmed threshold voltage 70 and the erased threshold voltage 75 will eventually decrease until the flash EEPROM cell 10 can no longer retain digital data reliably.

The related patent applications, included herein by reference, illustrate methods to improve the difference in the programmed threshold voltage and the erased threshold voltage by dual phase erasing methods eliminating charges from the floating gate and detrapping the charges from the tunneling oxide of the flash EEPROM cell.

SUMMARY OF THE INVENTION

An object of this invention is to provide a method for the erasure of data from a flash EEPROM.

Another object of this invention is to provide a method to eliminate electrical charges trapped in the tunneling oxide and within surface states at the interface of the semiconductor substrate.

Further another object of this invention is to eliminate electrical charges trapped in the tunneling oxide of a flash EEPROM to maintain proper separation of the programmed threshold voltage and the erased threshold voltage after extended programming and erasing cycles.

To accomplish these and other objects a method to erase a flash EEPROM cell begins by negative gate erasing the flash EEPROM to remove charges from the floating gate. The negative gate erasing begins by first applying a first relatively large negative voltage pulse to the control gate of the flash EEPROM. The first relatively large negative voltage pulse has a voltage of from approximately −5.0V to approximately −15.0V, preferably −10.0V.

Concurrently a first moderately large positive voltage pulse is applied to the source. The first moderately large positive voltage pulse has a voltage of from approximately +0.5V to approximately +5.0V, preferably +4.3V.

Also, concurrently a ground reference potential is applied to the first well and the semiconductor substrate, and the drain and second well are disconnected to allow the drain and second well to float.

At the completion of the negative gate erasing, the flash EEPROM cell is then source erased to further remove charges from the floating gate. The source erase procedure begins by floating the drain and the second well and concurrently applying the ground reference potential to the semiconductor substrate, the drain, and the first well. Simultaneously, a relatively large positive voltage pulse is applied to the source. The relatively large positive voltage pulse has a voltage of from approximately +5.0V to approximately +15.0V, preferably +10.0V.

Upon completion of the source erasing, the flash EEPROM is then channel erased to detrap charges from the tunneling oxide. The channel erase begins by applying a second relatively large negative voltage pulse to the control gate of the EEPROM cell and concurrently applying a second moderately large positive voltage pulse to the first well. The second relatively large negative voltage pulse has a voltage of from approximately −5.0V to approximately −15.0V, preferably −10.0V and the second moderately large positive voltage pulse has a voltage of from approximately +0.5V to approximately +5.0V, preferably +5.0V.

At this same time, a ground reference potential is applied to the semiconductor substrate and the drain, the source, and the second well are floated.

The detrapping the flash EEPROM allows a separation of a programmed threshold voltage from an erased threshold voltage to be maintained over the repeated writing and erasing of the flash EEPROM, thus improving the program/erase threshold voltage closure.

The first moderately large positive voltage pulse, the second moderately large positive voltage pulse, the first relatively large negative voltage pulse, relatively large positive voltage pulse, and the second relatively large negative voltage pulse each have a duration of approximately 10 m second to two seconds.

The duration of the second moderately large positive pulse and the second relatively large negative pulse will prevent degradation to the tunneling oxide during the source erasing due to a lesser electric field in the tunneling oxide.

BRIEF DESCRIPTION OF THE DRAWINGS

FIG. 1 is a cross-sectional view of flash EEPROM of the prior art.

FIG. 2a are timing diagrams of a negative gate erase cycle of the flash EEPROM of the prior art.

FIG. 2b is a plot of the threshold voltages versus the number of programming and erasing cycles, using the erasing cycle of the prior art, as shown in FIG. 2a.

FIG. 3a are timing diagrams of a source erase cycle of the flash EEPROM of the prior art.

FIG. 3b is a plot of the threshold voltages versus the number of programming and erasing cycles, using the erasing cycle of the prior art, as shown in FIG. 3a.

FIG. 4a are timing diagrams of a channel erase cycle of the flash EEPROM of the prior art.

FIG. 4b is a plot of the threshold voltages versus the number of programming and erasing cycles, using the erasing cycle of the prior art, as shown in FIG. 2a.

FIG. 6b is a plot of the threshold voltages versus the number of programming and erasing cycles using the erase cycle of this invention as shown in FIG. 6a.

DETAILED DESCRIPTION OF THE INVENTION

Figure 5:
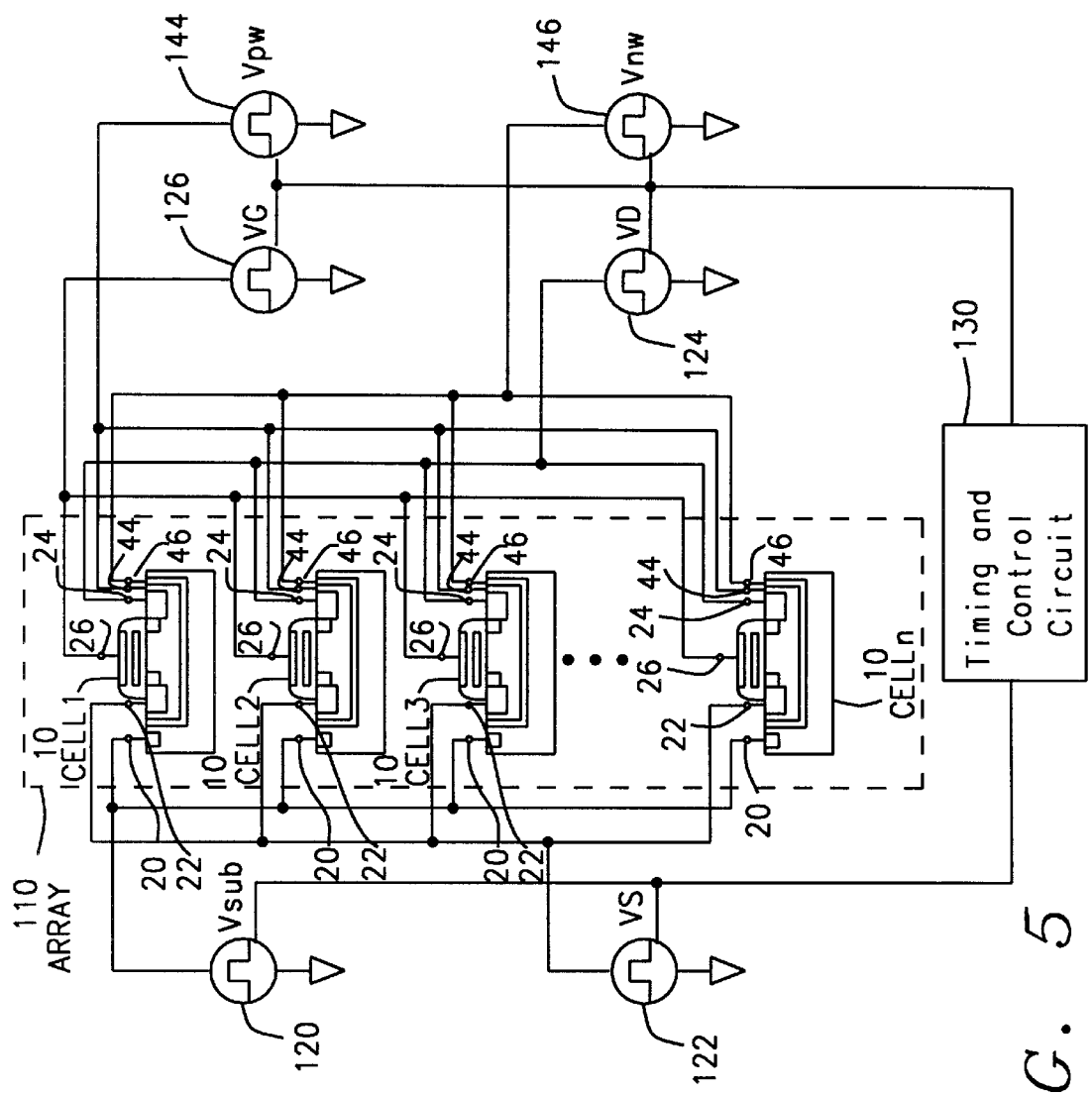
FIG. 5 is a diagram of an array of flash EEPROM cells showing the connections of the voltage generators of this invention.

Referring now to FIG. 5, an array 110 of flash EEPROM cells 10 is disposed upon a common substrate. For convenience of design, the cells Cell1, Cell2, Cell3, . . . , Celln will be formed into rows and column. The array will have auxiliary circuitry (not shown) that will address either the individual cells Cell1, Cell2, Cell3, . . . , Celln or groups of cells for reading from the cells or for writing or programming the cells. The writing or programming procedures will as described for the flash EEPROM cell of FIG. 1.

The connection for the substrate voltage generator VSub 120 will be connected through the terminal 20 to the P-type substrate. The connection of the source voltage generator VS 122 to the source region is through the terminal 22. The connection of the drain voltage generator VD 124 to the drain region is through terminal 24. The connection of the gate control voltage generator VG 126 to the control gate is through the terminal 26. The p-well voltage generator VPw 144 and the n-well voltage generator VNw 146 will be connected respectively to the p-well 45 and the n-well 47 through terminals 44 and 46. The timing and control circuitry 130 in conjunction with the auxiliary circuitry (not shown) will determine the voltages and timings for the substrate voltage generator VSub 120, the source voltage generator VS 122, the drain voltage generator VD 124, the gate control voltage generator VG 126 the p-well voltage generator VPw 144, and the n-well voltage generator VNw 146.

Figure 6A:
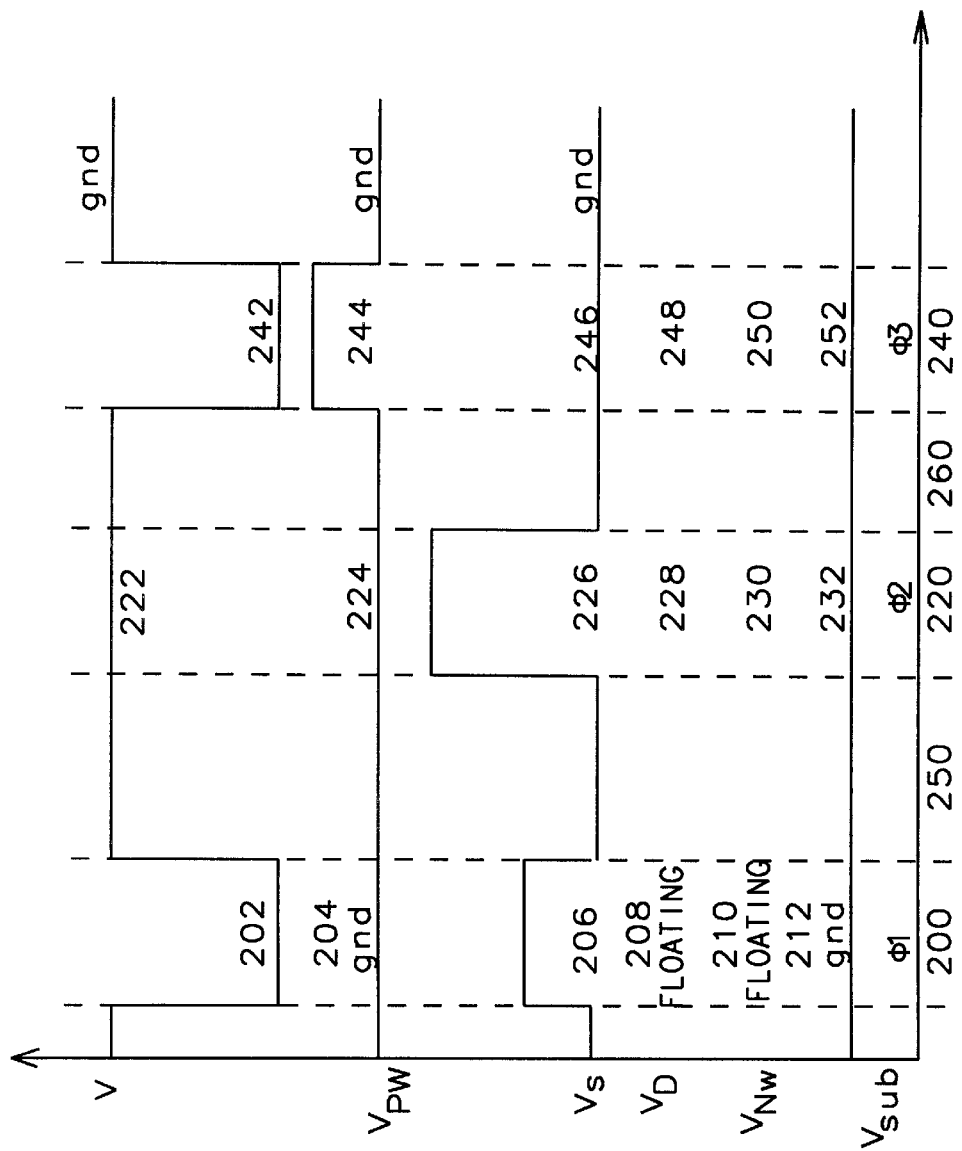
FIG. 6a is timing diagram of an erase cycle of a flash EEPROM of this invention.

Refer now to FIGS. 1, 5, and 6a to understand the multiple phase erase cycle of this invention. The initial period of the multiple phase erase cycle or negative gate erase cycle (φ1) 200 begins by setting 202 the control gate voltage generator VG 126 and thus the control gate 28 to a first relatively negative voltage of approximately −10.0V. The range of voltage for the first relatively large negative voltage is from approximately −5.0V to approximately −15.0V. Concurrently, the source voltage generator Vs 122 and thus the source region 16 are set 206 to a first moderately positive voltage of approximately +4.3 V. The first moderately positive voltage has a range of from approximately +0.5V to approximately +5.0V. At this same time, the P-well voltage generator VPw 144 and thus the P-well 45 and the substrate voltage generator VSub 120 and thus the semiconductor substrate 12 are set 204 and 212 to the ground reference potential. The drain voltage generator VD 124 and the N-well voltage generator VNw 146 are disconnected respectively from the drain region 14 and the N-well 47 to allow the drain region 14 and the N-well 47 to float.

Having terminated the negative gate erase cycle 200 (φ1), the source erase cycle (φ2) 220 of the multiple phase erase cycle can begin. The control gate voltage generator VG 126 is brought the ground reference potential to set the control gate 28 to the ground reference potential. Concurrently, the source voltage generator VS 122 is set to a relatively large positive voltage (10.0V) to bring the source region 16 to the relatively large positive voltage 226. At this time, the substrate voltage generator VSub 120 and thus the P-type substrate 12 and the P-well voltage generator 144 and thus the P-well 45 will remain at the ground reference potential (0V) 224 and 232. While the drain voltage generator VD 124 will remain disconnected from the drain region 14 thus maintaining the drain region 14 at a floating condition 228, and the n-well voltage generator VNw 146 will remain disconnected from the n-well 47 to keep the n-well 47 floating 230.

The voltage biases as described for the negative gate erase cycle (φ1) 200 and the source erase cycle (φ2) 220 create the electric field 66 within the tunneling oxide 36. The electrons 31 trapped on the floating gate 32 are extracted and forced into the source due to the Fowler-Nordheim tunneling above described.

The third phase or channel erase phase (φ3) 240 starts by setting the gate control voltage generator VG 126 and thus the control gate to a second relatively large negative voltage (−10V) 242. The range of the second relatively large negative voltage is from approximately −5.0V to approximately −15.0V. The source voltage generator VS 122 and thus the source region 16 is connected 246 to the ground reference potential. The p-well voltage generator VPw 144 and thus the p-well 45 will be set to a second moderately high positive voltage (+5.0V) 244. The range of the second moderately high positive voltage is from approximately +0.5V to approximately +5.0V. The n-well voltage generator VNw 146 will be disconnected from the n-well 47 to allow the n-well 47 to be floating 250. The drain voltage generator VD 124 will be disconnected from the drain region 14 to be floating 248. The substrate voltage generator VSub 120 and thus the P-type substrate 12 will be set to the ground reference potential (0V) 252. The voltages as described and shown in the channel erase phase (φ3) 240 will force the trapped charges 38 and 42 in the tunneling oxide 36 and the interface traps 40 of the flash EEPROM cell 10 will be forced by the electric field 66 to be removed to the P-well 45.

The periods 250 and 260 between the negative gate erase phase (φ1) 200 and the source erase phase (φ2) 220 and between the source erase phase (φ2) 220 and the channel erase phase (φ3) 240 act as a transition interval to respectively terminate the negative gate erase phase (φ1) 200 and the source erase phase (φ2) 220.

The transition intervals 250 and 260 each begin by bringing the source voltage generator VS 122, the p-well voltage generator VPw 144 and the gate control voltage generator VG 126 to the ground reference potential (0V). The substrate voltage generator VSub 120 will remain at the ground reference potential (0V). The drain voltage generator VD 124 will remain disconnected from the drain region 24 to keep the drain region 24 floating, and the n-well voltage generator VNw 146 will remain disconnected from the n-well 47 to keep the n-well 47 floating. The transition intervals 250 and 260 each have a time duration of from 0 to 2 m seconds.

The electric field 66 within tunneling oxide 36 must be in the saturation region. The field is dependent upon the voltage of the gate control voltage generator VG 126, the p-well voltage generator VPw 144 and the number of trapped electrons 40 in the tunneling oxide 36 and in the surface states 42. Thus, the voltage $V_{TU}$ across the tunneling oxide field becomes:

$$V_{TU} = \epsilon_{TU} d_{ox} = K_{C1}VG + K_{C2}Vs + \frac{Q_{trap}}{C_{ox}} + K_{C3}Vpw$$

Where:

$Q_{trap}$ is the charge of the electrons trapped in the floating gate 32.

$K_{C1}$ is the coupling ratio of the control gate 28.

$K_{C2}$ is the coupling ratio of the source 16.

$K_{C3}$ is the coupling ratio of the P-well 45.

$\epsilon_{TU}$ is the electrical field 66 present within the tunneling oxide 36.

$d_{ox}$ is the thickness of the tunneling oxide 36.

$C_{ox}$ is the capacitance between the floating gate 32 and the P-well 45

The magnitude applied voltages of the gate control voltage generator VG, and the P-well voltage generator VPw will be dependent on the thickness of the tunneling oxide 36 and the interpoly dielectric 30, which will vary with the technology parameters.

As can be seen from the above equation, the negative gate erase phase (φ1) 200 and the source erase phase (φ2) 220 will operate at high field due to the number of electrons available in the floating gate 32. Though the electrons 40 and 42 trapped in the tunneling oxide 36 can be detrapped the negative gate erase phase (φ1) 200 and the source erase phase (φ2) 220, a certain number of trapped centers will be generated due to the high field and high current that passes through the tunneling oxide 36. However, if the duration of the negative gate erase phase (φ1) 200 and the source erase phase (φ2) 220 is shortened compared to the prior art, the degradation can be minimized.

The channel erase phase (φ3) 240 will now operate at a relatively low field, since some of the electrons have been removed during the negative gate erase phase (φ1) 200 and the source erase phase (φ2) 220. This will prevent any generation of the positive charges or "hot holes" as described in FIG. 1 to be trapped in the tunneling oxide 36. These positive charges or "hot holes" will cause the degradation of the threshold voltage $V_T$ as shown in FIGS. 2b, 3b, and 4b. Since there will be no generation of the positive charges or "hot holes", there will be no degradation of the threshold voltage $V_T$ using the multiple mode erasing cycle of this invention over time as shown in FIG. 5b.

The relative period of time for the negative gate erase phase (φ1) 200, the source erase phase (φ2) 220, and channel erase phase (φ3) 240 of the multiple phase erase cycle is from approximately 10 m sec to 2 sec. in duration.

Figure 6B:
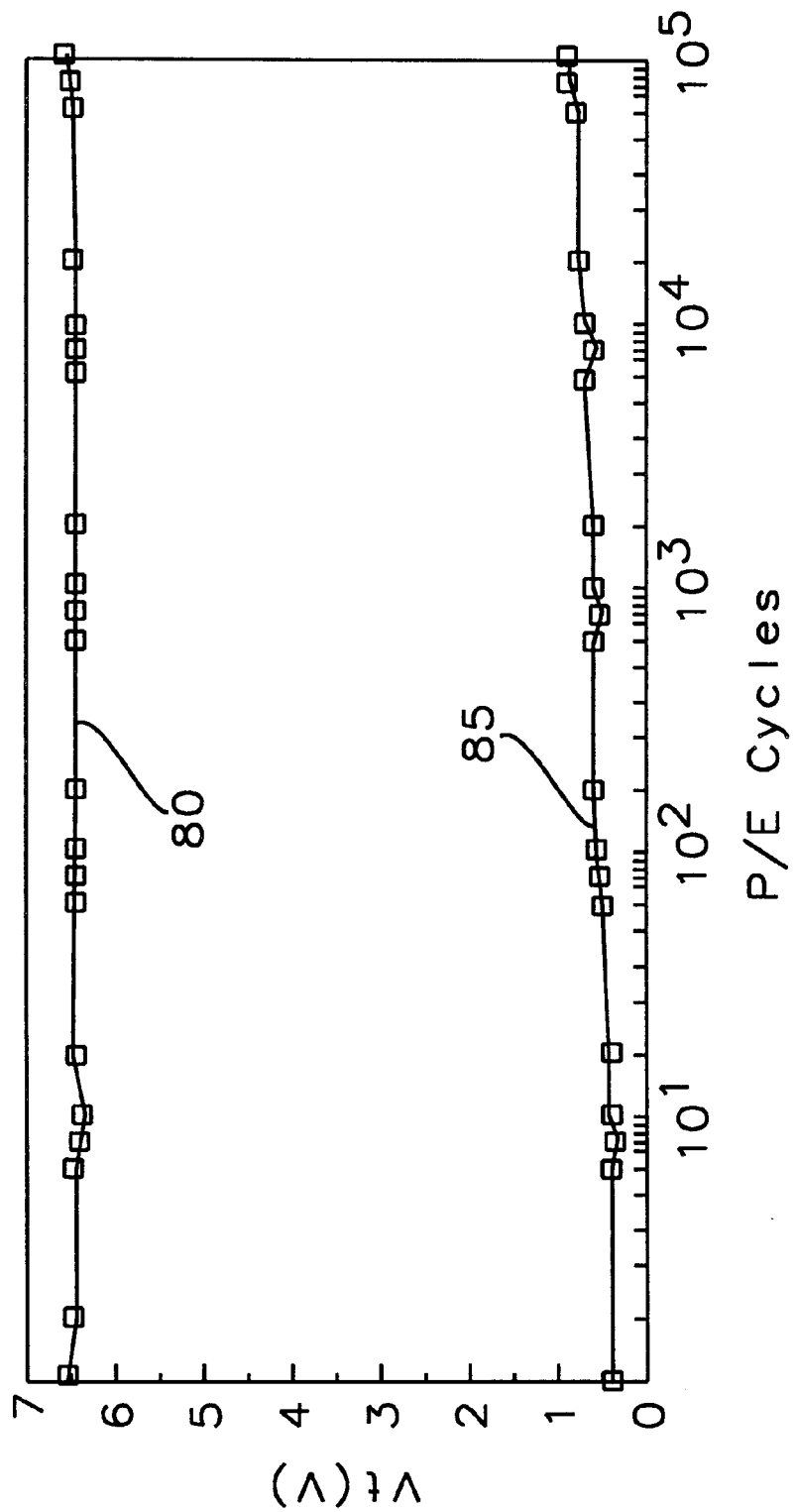
Figure 6C:
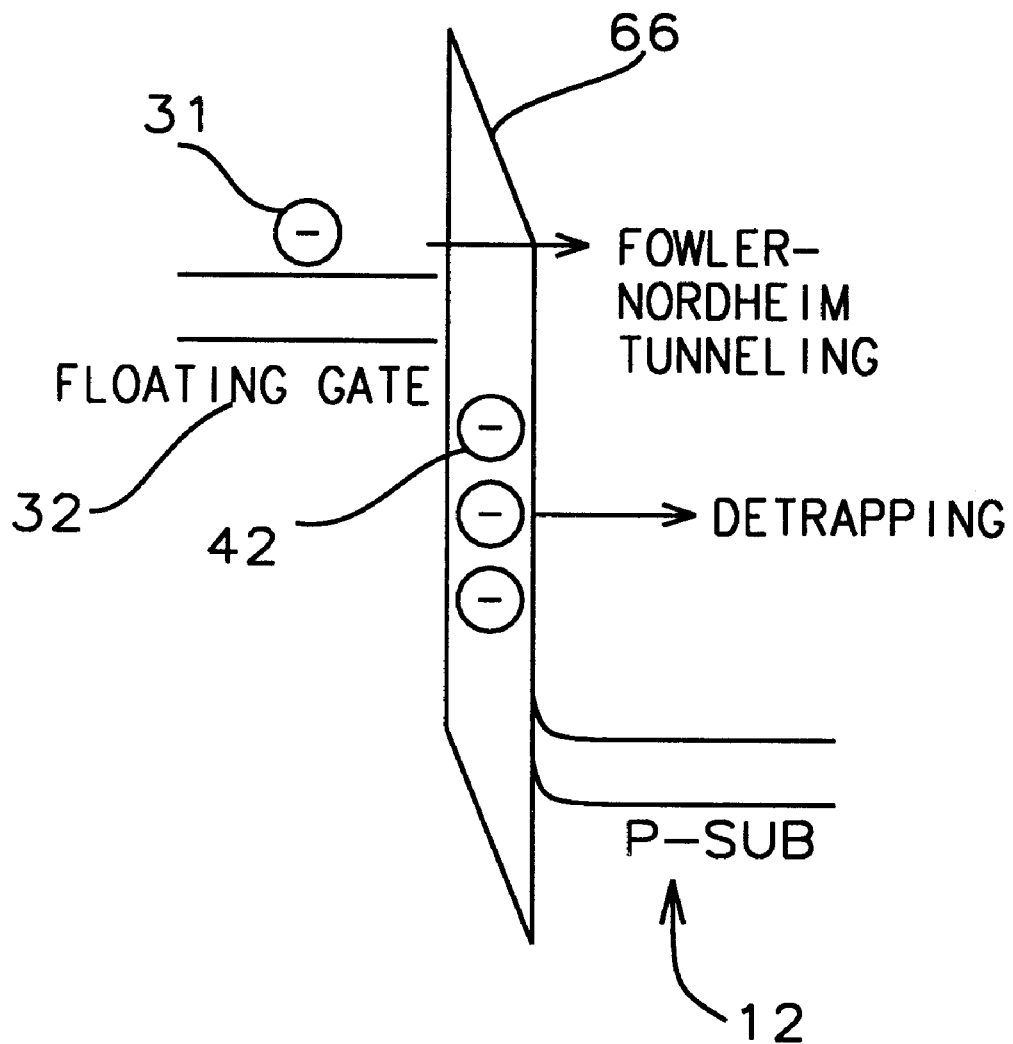
FIG. 6c is an energy band diagram of a flash EEPROM cell showing the removal of charges during an erasing cycle of this invention.

Refer now to FIGS. 1 and 6c for a description of the physical basis for the detrapping phase of the erase cycle of the flash EEPROM of this invention. As above described, during the channel erase phase (φ3) 240, the gate control voltage generator VG is set to the second relatively large negative voltage (−10V). Since the gate control voltage generator VG 126 is connected through the terminal 26 to the control gate 28, the control gate 28 w,ill be set to the second relatively large negative voltage (−10V). The drain region 14 and the n-well 47 is disconnected from their respective voltage generators and allowed to be floating. The voltage of the substrate voltage generator Vsub 120 and the source voltage generator VS 122 are set to the ground reference potential (0V) which is respectively connected through terminal 20 to the P-type substrate 12 and terminal 22 to the source region 16. The P-well voltage generator VPw and thus the source will be set to the second moderately large voltage (5V).

The voltages as described will set up an electric field 66 in the gate dielectric or tunneling oxide 36. Those electrons 42 trapped in the tunneling oxide 36 will be forced to be dissipated in the P-well, while there will be no positive charges or "hot holes" generated at during the source erase cycle. Thus eliminating any residual charges from the floating gate 32 or trapped charges 42 from the tunneling oxide 36.

This process will insure that the erased threshold voltage for the flash EEPROM cell 10 will return to the low threshold voltage of a completely erased cell. The elimination of the trapped charges 42 will also allow the appropriate increase of the programmed threshold voltage to the high threshold voltage approximately (6V) of a programmed cell.

As is shown in FIG. 6b, the programmed threshold voltage 80 will remain at a relatively constant value of approximately 6V (changing by less than 0.5V) for at least 100,000 programming/erase cycles. Also, as can be seen, the erased threshold voltage 85 will remain at a constant value of approximately 0.5V for the 100,000 programming/erase cycles. By not degrading the threshold as seen in FIGS. 2b, 3b, and 4b, the flash EEPROM cell 10 of FIG. 1 and the flash EEPROM array 110 of FIG. 5 will maintain operation without failure for programming/erase cycle in excess of 100,000 cycles.

While this invention has been particularly shown and described with reference to the preferred embodiments thereof, it will be understood by those skilled in the art that various changes in form and details may be made without departing from the spirit and scope of the invention.

What is claimed is:

1. A method to erase a flash EEPROM cell, which is comprised of a source and a drain diffused within a first well of a first conductivity type which is diffused into a second well of a second conductivity type which is further diffused in to a semiconductor substrate of the first conductivity type, and a control gate, a floating gate, and a tunneling oxide disposed upon the semiconductor substrate, to improve a write/erase threshold voltage closure from repeatedly writing and erasing said flash EEPROM cell, comprising the steps of:

negative gate erasing said flash EEPROM to remove charges from said floating gate by the steps of:
applying a first relatively large negative voltage pulse to said control gate of said flash EEPROM,
concurrently applying a first moderately large positive voltage pulse to said source,
concurrently applying a ground reference potential to said first well and said semiconductor substrate, and
concurrently disconnecting said drain and second well to allow said drain and second well are floating; then
source erasing said flash EEPROM cell to further remove charges from said floating gate by the steps of:
floating said drain and said second well,
concurrently applying the ground reference potential to said semiconductor substrate, said drain, and said first well, and
concurrently applying a relatively large positive voltage pulse to said source; and then
channel erasing said flash EEPROM cell to detrap charges from the tunneling oxide by the steps of,
applying a second relatively large negative voltage pulse to the control gate of said EEPROM cell,
concurrently applying a second moderately large positive voltage pulse to said first well,
concurrently applying a ground reference potential to the semiconductor substrate, and
concurrently floating said drain, said source, and said second well.

2. The method to erase a flash EEPROM cell of claim 1 wherein detrapping the flash EEPROM allows a separation of a programmed threshold voltage from an erased threshold voltage to be maintained over the repeated writing and erasing of said flash EEPROM, thus improving said write/erase threshold voltage closure.

3. The method to erase a flash EEPROM cell of claim 1 wherein the first moderately large positive voltage pulse has a voltage of from approximately +0.5V to approximately +5.0V.

4. The method to erase a flash EEPROM cell of claim 1 wherein the first moderately large positive voltage pulse has a voltage of +5.0V.

5. The method to erase a flash EEPROM cell of claim 1 wherein the second moderately large positive voltage pulse has a voltage of from approximately +0.05V to approximately +5.0V.

6. The method to erase a flash EEPROM cell of claim 1 wherein the second moderately large positive voltage pulse has a voltage of +4.3V.

7. The method to erase a flash EEPROM cell of claim 1 wherein the first relatively large negative voltage pulse has a voltage of from approximately −5.0V to approximately −15.0V.

8. The method to erase a flash EEPROM cell of claim 1 wherein the first relatively large negative voltage pulse has a voltage of −10V.

9. The method to erase a flash EEPROM cell of claim 1 wherein the second relatively large negative voltage pulse has a voltage of from approximately −5.0V to approximately −15.0V.

10. The method to erase a flash EEPROM cell of claim 1 wherein the second relatively large negative voltage pulse has a voltage of −10V.

11. The method to erase a flash EEPROM cell of claim 1 wherein the relatively large positive voltage pulse has a voltage of from approximately +5.0V to approximately +15.0V.

12. The method to erase a flash EEPROM cell of claim 1 wherein the relatively large positive voltage pulse has a voltage of +10V.

13. The method to erase a flash EEPROM cell of claim 1 wherein the first moderately large positive voltage pulse, the second moderately large positive voltage pulse, the first relatively large negative voltage pulse, relatively large positive voltage pulse, and the second relatively large negative voltage pulse each have a duration of approximately 10 m second to two seconds.

14. The method to erase a flash EEPROM cell of claim 1 wherein a duration of the second moderately large positive pulse and the second relatively large negative pulse will prevent degradation to the tunneling oxide during the source erasing due to a lesser electric field in said tunneling oxide.

15. A non-volatile semiconductor memory device comprising:
a semiconductor substrate of a first conductivity type;
a first diffusion well of a second conductivity type diffused into said semiconductor substrate;
a second diffusion well of the first conductivity type diffused into said first diffusion well
a pair of diffusions of a second conductivity type spaced distally from one another to form a source region and a drain region within said second diffusion well;

a tunneling oxide insulation disposed upon said semiconductor substrate in a region generally between the source region and drain region in correspondence with a channel region and having a thickness which allows tunneling of carriers there through;

a floating gate electrode disposed upon said tunneling oxide insulation generally in correspondence with said channel region;

an inter-poly dielectric insulation disposed upon said floating gate electrode to insulate said floating gate;

a control gate electrode disposed upon said inter-poly dielectric insulation generally aligned with said floating gate; and an erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device by the steps of:

negative gate erasing said flash EEPROM to remove charges from said floating gate by the steps of:
  applying a first relatively large negative voltage pulse to said control gate of said flash EEPROM,
  concurrently applying a first moderately large positive voltage pulse to said source,
  concurrently applying a ground reference potential to said first well and said semiconductor substrate, and
  concurrently disconnecting said drain and second well to allow said drain and second well are floating; then source erasing said flash EEPROM cell to further remove charges from said floating gate by the steps of:
  floating said drain and said second well,
  concurrently applying the ground reference potential to said semiconductor substrate, said drain, and said first well, and
  concurrently applying a relatively large positive voltage pulse to said source; and then channel erasing said flash EEPROM cell to detrap charges from the tunneling oxide by the steps of,
  applying a second relatively large negative voltage pulse to the control gate of said EEPROM cell,
  concurrently applying a second moderately large positive voltage pulse to said first well,
  concurrently applying a ground reference potential to the semiconductor substrate, and
  concurrently floating said drain, said source, and said second well.

16. The non-volatile semiconductor memory device of claim 15 wherein detrapping the flash EEPROM allows a separation of a programmed threshold voltage from an erased threshold voltage to be maintained over the repeated writing and erasing of said flash EEPROM, thus improving said write/erase threshold voltage closure.

17. The non-volatile semiconductor memory device of claim 15 wherein the first moderately large positive voltage pulse has a voltage of from approximately +0.5V to approximately +5.0V.

18. The non-volatile semiconductor memory device of claim 15 wherein the first moderately large positive voltage pulse has a voltage of +4.3V.

19. The non-volatile semiconductor memory device of claim 15 wherein the second moderately large positive voltage pulse has a voltage of from approximately +0.5V to approximately +5.0V.

20. The non-volatile semiconductor memory device of claim 15 wherein the second moderately large positive voltage pulse has a voltage of +5.0V.

21. The non-volatile semiconductor memory device of claim 15 wherein the first relatively large negative voltage pulse has a voltage of from approximately −5.0V to approximately −15.0V.

22. The non-volatile semiconductor memory device of claim 15 wherein the first relatively large negative voltage pulse has a voltage of −10V.

23. The non-volatile semiconductor memory device of claim 15 wherein the second relatively large negative voltage pulse has a voltage of from −5.0V to approximately −15.0V.

24. The non-volatile semiconductor memory device of claim 15 wherein the second relatively large negative voltage pulse has a voltage of −10V.

25. The non-volatile semiconductor memory device of claim 15 wherein the relatively large positive voltage pulse has a voltage of from approximately +5.0V to approximately +15.0V.

26. The non-volatile semiconductor memory device of claim 15 wherein the relatively large positive voltage pulse has a voltage of +10V.

27. The non-volatile semiconductor memory device of claim 15 wherein the first moderately large positive voltage pulse, the second moderately large positive voltage pulse, the first relatively large negative voltage pulse, relatively large positive voltage pulse, and the second relatively large negative voltage pulse each have a duration of approximately 10 m second to two seconds.

28. The non-volatile semiconductor memory device of claim 15 wherein a wherein the duration of the second moderately large positive pulse and the second relatively large negative pulse will prevent degradation to the tunneling oxide during the source erasing due to a lesser electric field in said tunneling oxide.

29. The non-volatile semiconductor memory device of claim 15 wherein the duration of the first moderately large positive pulse and the first relatively large negative pulse will prevent degradation to the tunneling oxide during the duration of the second moderately large positive voltage pulse, and the second relatively large negative voltage pulse due to a lesser electric field in said tunneling oxide.

30. A non-volatile semiconductor memory device comprising:
  a semiconductor substrate of a first conductivity type;
  a first diffusion well of a second conductivity type diffused into said semiconductor substrate;
  a second diffusion well of the first conductivity type diffused into said first diffusion well
  a plurality of memory cells arranged in an array wherein each cell comprises:
    a pair of diffusions of a second conductivity type spaced distally from one another to form a source region and a drain region within said second diffusion well,
    a tunneling oxide insulation disposed upon said semiconductor substrate in a region generally between the source region and drain region in correspondence with a channel region and having a thickness which allows tunneling of carriers there through,
    a floating gate electrode disposed upon said tunneling oxide insulation generally in correspondence with said channel region,
    an inter-poly dielectric insulation disposed upon said floating gate electrode to insulate said floating gate, and a control gate electrode disposed upon said inter-poly dielectric insulation generally aligned with said floating gate; and an erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device wherein charges are removed from the floating gate by the steps of:

negative gate erasing said flash EEPROM to remove charges from said floating gate by the steps of:
coupling a first voltage source to the control gate to apply a first relatively large negative voltage pulse to said control gate of said flash EEPROM,
simultaneously coupling a second voltage source to the source region applying a first moderately large positive voltage pulse to said source,
simultaneously coupling a ground reference potential to said first well and said semiconductor substrate, and
simultaneously disconnecting said drain and second well to allow said drain and second well are floating, then source erasing said flash EEPROM cell to further remove charges from said floating gate by the steps of:
disconnecting said drain and second well to allow said drain and second well are floating,
concurrently coupling the ground reference potential to said semiconductor substrate, said drain, and said first well, and
concurrently coupling a third voltage source to apply a relatively large positive voltage pulse to said source, and then channel erasing said flash EEPROM cell to detrap charges from the tunneling oxide by the steps of,
coupling a fourth voltage source to apply a second relatively large negative voltage pulse to the control gate of said EEPROM cell,
concurrently coupling a fifth voltage source to apply a second moderately large positive voltage pulse to said first well,
concurrently coupling a ground reference potential to the semiconductor substrate, and
concurrently disconnecting the drain, the source, and the second well to allow said drain, said source, and said second well to float.

31. The non-volatile semiconductor memory device of claim 30 wherein detrapping the flash EEPROM allows a separation of a programmed threshold voltage from an erased threshold voltage to be maintained over the repeated writing and erasing of said flash EEPROM, thus improving said write/erase threshold voltage closure.

32. The non-volatile semiconductor memory device of claim 30 wherein the first moderately large positive voltage pulse has a voltage of from approximately +0.5V to approximately +5.0V.

33. The non-volatile semiconductor memory device of claim 30 wherein the first moderately large positive voltage pulse has a voltage of +4.3V.

34. The non-volatile semiconductor memory device of claim 30 wherein the second moderately large positive voltage pulse has a voltage of from approximately +0.5V to approximately +5.0V.

35. The non-volatile semiconductor memory device of claim 30 wherein the second moderately large positive voltage pulse has a voltage of +5.0V.

36. The non-volatile semiconductor memory device of claim 30 wherein the first relatively large negative voltage pulse has a voltage of from approximately –5.0V to approximately –15.0V.

37. The non-volatile semiconductor memory device of claim 30 wherein the first relatively large negative voltage pulse has a voltage of –10V.

38. The non-volatile semiconductor memory device of claim 30 wherein the second relatively large negative voltage pulse has a voltage of from approximately –5.0V to approximately –15.0V.

39. The non-volatile semiconductor memory device of claim 30 wherein the second relatively large negative voltage pulse has a voltage of –10V.

40. The non-volatile semiconductor memory device of claim 30 wherein the relatively large positive voltage pulse has a voltage of from approximately +5.0V to approximately +15.0V.

41. The non-volatile semiconductor memory device of claim 30 wherein the relatively large positive voltage pulse has a voltage of +10V.

42. The non-volatile semiconductor memory device of claim 30 wherein the first moderately large positive voltage pulse, the second moderately large positive voltage pulse, the first relatively large negative voltage pulse, relatively large positive voltage pulse, and the second relatively large negative voltage pulse each have a duration of approximately 10 m second to two seconds.

43. The non-volatile semiconductor memory device of claim 30 wherein a wherein the duration of the second moderately large positive pulse and the second relatively large negative pulse will prevent degradation to the tunneling oxide during the source erasing due to a lesser electric field in said tunneling oxide.

44. The non-volatile semiconductor memory device of claim 30 wherein the duration of the first moderately large positive pulse and the first relatively large negative pulse will prevent degradation to the tunneling oxide during the duration of the second moderately large positive voltage pulse, and the second relatively large negative voltage pulse due to a lesser electric field in said tunneling oxide.

45. An erasing circuit to remove charges and to detrap charges from flash EEPROM cells, including a source and a drain diffused within a first well of a first conductivity type which is diffused into a second well of a second conductivity type which is further diffused in to a semiconductor substrate of the first conductivity type, and having a control gate, a floating gate, and a tunneling oxide disposed upon the semiconductor substrate, comprising:

a first voltage source coupled to the control gate;
a second voltage source coupled to the source region;
a third voltage source coupled to the drain region;
a fourth voltage source coupled to the semiconductor substrate;
a fifth voltage source coupled to the first well;
a sixth voltage source coupled to the second well
an erasing control means coupled to the first, second, third, fourth, fifth, and sixth voltage sources to control said first, second, third, fourth, fifth, and sixth voltage sources, to remove electrical charges from said floating gate electrode and to detrap trapped electrical charges from said tunneling oxide insulation to improve a separation factor of a programmed threshold voltage and an erased threshold voltage of said non-volatile semiconductor memory device wherein charges are removed from the floating gate by the steps of:

negative gate erasing said flash EEPROM to remove charges from said floating gate by the steps of:
  coupling the first voltage source to the control gate to apply a first relatively large negative voltage pulse to said control gate of said flash EEPROM,
  simultaneously coupling the second voltage source to the source region applying a first moderately large positive voltage pulse to said source,
  simultaneously forcing the fourth and fifth voltage source to a ground reference potential to apply said ground reference potential to said first well and said semiconductor substrate, and
  simultaneously disconnecting said third and sixth voltage sources respectively from said drain and second well to allow said drain and second well to float, then
source erasing said flash EEPROM cell to further remove charges from said floating gate by the steps of:
  disconnecting said third and sixth voltage sources respectively from said drain and second well to allow said drain and second well to float,
  concurrently forcing said third, fourth, and fifth voltage source to the ground reference potential to set said semiconductor substrate, said drain, and said first well to the ground reference potential, and
  concurrently forcing said third voltage source to apply a relatively large positive voltage pulse to said source, and then
channel erasing said flash EEPROM cell to detrap charges from the tunneling oxide by the steps of,
  forcing the fourth voltage source to apply a second relatively large negative voltage pulse to the control gate of said EEPROM cell,
  concurrently forcing the fifth voltage source to apply a second moderately large positive voltage pulse to said first well,
  concurrently forcing the fourth voltage source to the ground reference potential to set the semiconductor substrate to the ground reference potential,
  concurrently disconnecting the second, third and sixth voltage sources from the drain, the source, and the second well to allow said drain, said source, and said second well to float.

46. The erasing means of claim 45 wherein detrapping the flash EEPROM allows a separation of a programmed threshold voltage from an erased threshold voltage to be maintained over the repeated writing and erasing of said flash EEPROM, thus improving said write/erase threshold voltage closure.

47. The erasing means of claim 45 wherein the first moderately large positive voltage pulse has a voltage of from approximately +0.5V to approximately +5.0V.

48. The erasing means of claim 45 wherein the first moderately large positive voltage pulse has a voltage of +4.3V.

49. The erasing means of claim 45 wherein the second moderately large positive voltage pulse has a voltage of from approximately +0.5V to approximately +5.0V.

50. The erasing means of claim 45 wherein the second moderately large positive voltage pulse has a voltage of +5.0V.

51. The erasing means of claim 45 wherein the first relatively large negative voltage pulse has a voltage of from approximately −5.0V to approximately −15.0V.

52. The erasing means of claim 45 wherein the first relatively large negative voltage pulse has a voltage of −10V.

53. The erasing means of claim 45 wherein the second relatively large negative voltage pulse has a voltage of from −5.0V to approximately −15.0V.

54. The erasing means of claim 45 wherein the second relatively large negative voltage pulse has a voltage of −10V.

55. The erasing means of claim 45 wherein the relatively large positive voltage pulse has a voltage of from approximately +5.0V to approximately +15.0V.

56. The erasing means of claim 45 wherein the relatively large positive voltage pulse has a voltage of +10V.

57. The erasing means of claim 45 wherein the first moderately large positive voltage pulse, the second moderately large positive voltage pulse, the first relatively large negative voltage pulse, relatively large positive voltage pulse, and the second relatively large negative voltage pulse each have a duration of approximately 10 m second to two seconds.

58. The erasing means of claim 45 wherein a wherein the duration of the second moderately large positive pulse and the second relatively large negative pulse will prevent degradation to the tunneling oxide during the source erasing due to a lesser electric field in said tunneling oxide.

59. The erasing means of claim 45 wherein the duration of the first moderately large positive pulse and the first relatively large negative pulse will prevent degradation to the tunneling oxide during the duration of the second moderately large positive voltage pulse, and the second relatively large negative voltage pulse due to a lesser electric field in said tunneling oxide.

* * * * *